United States Patent [19]
Florian et al.

[11] Patent Number: 5,546,050
[45] Date of Patent: Aug. 13, 1996

[54] RADIO FREQUENCY BUS LEVELING SYSTEM

[75] Inventors: Michael H. Florian, Bellevue; Harold J. Redd, Seattle; David R. Hogue, Renton; Rodney K. Bonebright, Milton, all of Wash.

[73] Assignee: The Boeing Company, Seattle, Wash.

[21] Appl. No.: 403,408

[22] Filed: Mar. 14, 1995

[51] Int. Cl.$^6$ .................................................. H03G 3/30
[52] U.S. Cl. ............................. 330/282; 330/52; 330/86; 330/132
[58] Field of Search ............................. 330/52, 86, 132, 330/282

[56] References Cited

U.S. PATENT DOCUMENTS

| | | | |
|---|---|---|---|
| 3,105,942 | 10/1963 | Hermes | 330/282 |
| 3,781,703 | 12/1973 | Duty | 330/86 X |
| 4,352,200 | 9/1982 | Oxman | 455/41 |
| 4,428,078 | 1/1984 | Kuo | 455/3 |
| 4,584,603 | 4/1986 | Harrison | 358/86 |
| 4,647,980 | 3/1987 | Steventon et al. | 358/254 |
| 4,866,515 | 9/1989 | Tagawa et al. | 358/86 |
| 5,084,864 | 1/1992 | Turnbull et al. | 370/24 |
| 5,214,505 | 5/1993 | Rabowsky et al. | 358/86 |
| 5,216,384 | 6/1993 | Vanhecke | 330/279 |
| 5,220,419 | 6/1993 | Sklar et al. | 358/86 |

FOREIGN PATENT DOCUMENTS

| | | | |
|---|---|---|---|
| 82519 | 6/1980 | Japan | 330/52 |
| 136910 | 6/1987 | Japan | 330/282 |

*Primary Examiner*—James B. Mullins
*Attorney, Agent, or Firm*—Christensen O'Connor Johnson & Kindness PLLC

[57] ABSTRACT

A bus leveling system for automatically monitoring and maintaining the amplitude of a radio frequency (RF) signal carded on a bus. A two-stage variable gain amplifier (64) is connected in series with the bus. Each stage of the variable gain amplifier is constructed with a PIN diode (84, 86) in a feedback path of the stage. The amplification of the variable gain amplifier is varied by the injection of current into the feedback path to adjust the resistance of the PIN diodes. A control circuit having an RE detector (78) is provided to monitor and adjust the gain generated by the variable gain amplifier. Preferably, the control circuit and the variable gain amplifier are incorporated into an Application Specific Integrated Circuit (ASIC) (62). The RF detector is constructed of two Gilbert multipliers (202, 204) to minimize errors caused by operating condition changes, including variations in power supply voltage, temperature, or process.

33 Claims, 7 Drawing Sheets

RADIO FREQUENCY BUS LEVELING SYSTEM

FIELD OF THE INVENTION

The present invention relates to signal amplifiers, and more particularly to an amplifier for the automatic amplitude leveling of a radio frequency signal carded on a bus.

BACKGROUND OF THE INVENTION

Many of the next generation of commercial passenger aircraft will incorporate an advanced passenger entertainment system in the cabin. In such an entertainment system, each passenger seat will be provided with an individually controllable audio receiver or visual display. The audio receiver will allow a passenger to listen to and select among several different channels of music programming. The video display will allow a passenger to play video games, select among a number of different movies or shows, or connect his or her portable computer to the video display to use as a monitor. The passenger entertainment system will therefore allow passengers to entertain themselves during long flights.

Incorporating an individualized passenger entertainment system in an aircraft is a challenging engineering problem. Multiple channels of audi must be transmitted to each of the passenger seats from a central control location. Since most commercial passenger aircraft have several hundred seats, a large network must be provided within each aircraft to allow signal distribution. The audio and video signal reception must be sufficiently strong at each passenger seat, otherwise the passenger will receive programming filled with static. Compounding the problem of designing an adequate distribution network is the variability in aircraft layout. Because most aircraft manufacturers sell many different styles of a single aircraft with a variety of seating arrangements, it is not possible to design a standard network for inclusion in all the aircraft. Seats are typically added to and removed from an aircraft during the aircrafts lifetime, changing the seating configuration within a given aircraft. As the number and location of seats change, the cable lengths in the network change and the total load on the network changes. Each change has an effect upon the signal quality of the entertainment system. A passenger entertainment system must therefore include a distribution network that is capable of dynamically compensating to account for the changing conditions that occur as the seating arrangement of the aircraft changes.

A typical passenger entertainment system resembles a small cable TV system. Each channel of audio and video programming is modulated onto an RF carrier. The RF carriers are then multiplexed onto a single transmission line at a central control station, and transmitted over a single coaxial cable bus to a series of intermediate stations. Each intermediate station is designed to provide the signal to different regions of the aircraft. At each area of the aircraft, the signal is further tapped to provide individual signals to each passenger seat. Because of the multiple splitting of the signal that occurs, the power level of the signal has a tendency to drop the further signal gets from the central control station. Additionally, the inherent resistance of the coaxial bus also dissipates the power of the entertainment signal. In order to maintain signal quality, it is therefore important to maintain adequate RF signal power levels throughout the system. In order to compensate for the loss of power due to signal transmissions, amplifiers are typically provided throughout the system components. The amplifiers amplify the entertainment signal to ensure the quality of the signal received by each passenger.

An example of a passenger entertainment system having distributed amplifiers is described in U.S. Pat. No. 5,220,419 entitled "Automatic RF Leveling In Passenger Aircraft Video Distribution System." The system includes a number of stations (18, 28) which tap and split an audio/video signal that is carried on a cable (16). Each of the stations includes a variable gain amplifier that is controlled by a microprocessor. The variable gain amplifier consists of a variable attenuator having an output connected to an amplifier of predetermined gain. The microprocessor monitors the signal level on the cable, and adjusts the attenuation provided by the variable attenuator to set the signal to the desired level. The system disclosed in U.S. Pat. No. 5,220,419 also allows the microprocessor to communicate among the various stations. If one station is unable to provide sufficient amplification to the signal due to the operating limits of the variable gain amplifier, a station located closer to the signal source increases the amplification that it provides. Several stations can therefore be networked together to provide appropriate amplification and ensure that the signal power level is sufficient throughout the system.

A passenger entertainment system constructed from a number of discrete components, such as suggested in U.S. Pat. No. 5,220,419, has several shortcomings. Because all electrical systems on an aircraft must operate from an onboard power supply, it is desirable to minimize the power consumption of any system. A passenger aircraft video distribution system having a number of discrete components will generally consume a substantial amount of power. Not only does this tax the power supply of an aircraft, but the corresponding generation of heat by the system requires further compensation by the aircraft climate control to maintain passenger safety and comfort.

Each part included in a passenger aircraft video distribution system contributes to the cost of the system. The inclusion of multiple discrete components at each station in the system has a tendency to further increase the overall system price. Because an aircraft will typically have several hundred seats, a passenger entertainment system can become prohibitively expensive if costs are not kept to a minimum.

Finally, the number of discrete components contained in a distribution system adds to the physical size of the system. As those who have flown on a commercial aircraft will attest, the amount of space in and around the passenger seat is limited. Any passenger entertainment system incorporated into the seats should therefore encompass as small a space as possible. Not only does this increase the comfort of the passenger, but any weight savings that are made translate into a greater operating efficiency for the aircraft itself.

The present invention is directed to providing an automatic leveling circuit for a distribution network of a passenger aircraft entertainment system that overcomes or minimizes the above-mentioned problems.

SUMMARY OF THE INVENTION

In accordance with this invention, a system for automatically monitoring and maintaining the amplitude of an RF signal carded on a bus is provided. The system includes a two-stage variable gain amplifier, connected in series with the bus, and a control circuit. Each amplifier stage contains a PIN diode in a feedback path from the output to the input of the amplifier stage. Each stage of the amplifier also has a control input in the feedback path, such that current injected in the control input will adjust the gain of the amplifier stage by varying the resistance of the PIN diode. The control circuit is coupled to the output of the variable gain amplifier and the control inputs of the feedback paths. The control circuit monitors the amplitude of a component of the signal carried by the bus and adjusts the gain of the variable gain amplifier to maintain the component of the signal at a desired amplitude.

In accordance with other aspects of this invention, connected to the output of the variable gain amplifier is a band-pass filter that filters a pilot tone from an entertainment signal carried on the bus. The pilot tone, which forms the component of the bus signal that is monitored, is indicative of the overall amplitude of the entertainment signal carried on the RF bus. The tone may be a dedicated signal added to the entertainment signal or a component of the signal.

In accordance with another aspect of this invention, connected to an output of the filter is an RF detector. The RF detector compares an RMS rectified amplitude of the pilot tone with a voltage reference. If there is a difference between the amplitude of the pilot tone and the voltage reference, the detector generates a control signal that determines the amount of current injected into the control input in the feedback path of each variable gain amplifier stage. The control signal determines the amplification of the variable gain amplifier and maintains a desired amplitude level of the entertainment signal. In a preferred embodiment of the invention, the radio frequency bus leveling system can therefore be placed throughout a passenger entertainment system to maintain the appropriate signal level.

In accordance with further aspects of this invention, buffers are coupled to the output of the variable gain amplifier. The buffers act as active splitters to provide RF power taps from the bus without causing a significant power loss on the bus. When coupled to passenger seat electronics, the buffers also provide a high level of isolation between the passenger seat electronics and the bus.

In accordance with still other aspects of the invention, several of the system components are incorporated into an Application Specific Integrated Circuit (ASIC). Specifically, the two-stage variable gain amplifier (except for the PIN diodes), RF detector, buffers, and accompanying circuitry are constructed in a single ASIC. Incorporating the majority of the system components into an ASIC reduces the number of discrete components in the bus leveling system, minimizing system cost and power consumption. The placement of the components in a single ASIC additionally improves system operation by reducing variations caused by changes in temperature, power supply voltage, or construction. The radio frequency bus leveling system of the present invention therefore accurately amplifies, conditions, and distributes an entertainment signal to the remainder of the entertainment system regardless of operating conditions.

In accordance with yet another aspect of the invention a novel construction for an RF detector is disclosed. The RF detector is constructed of two Gilbert multipliers that are connected to a current comparator. One Gilbert multiplier produces a load current proportional to the RAMS rectified voltage of the pilot tone. The other Gilbert cell multiplier produces a reference current that is proportional to a reference voltage generated by a bandgap reference. The load and reference currents are compared by the current comparator, and the output from the current comparator is used to adjust the gain of the variable gain amplifier.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
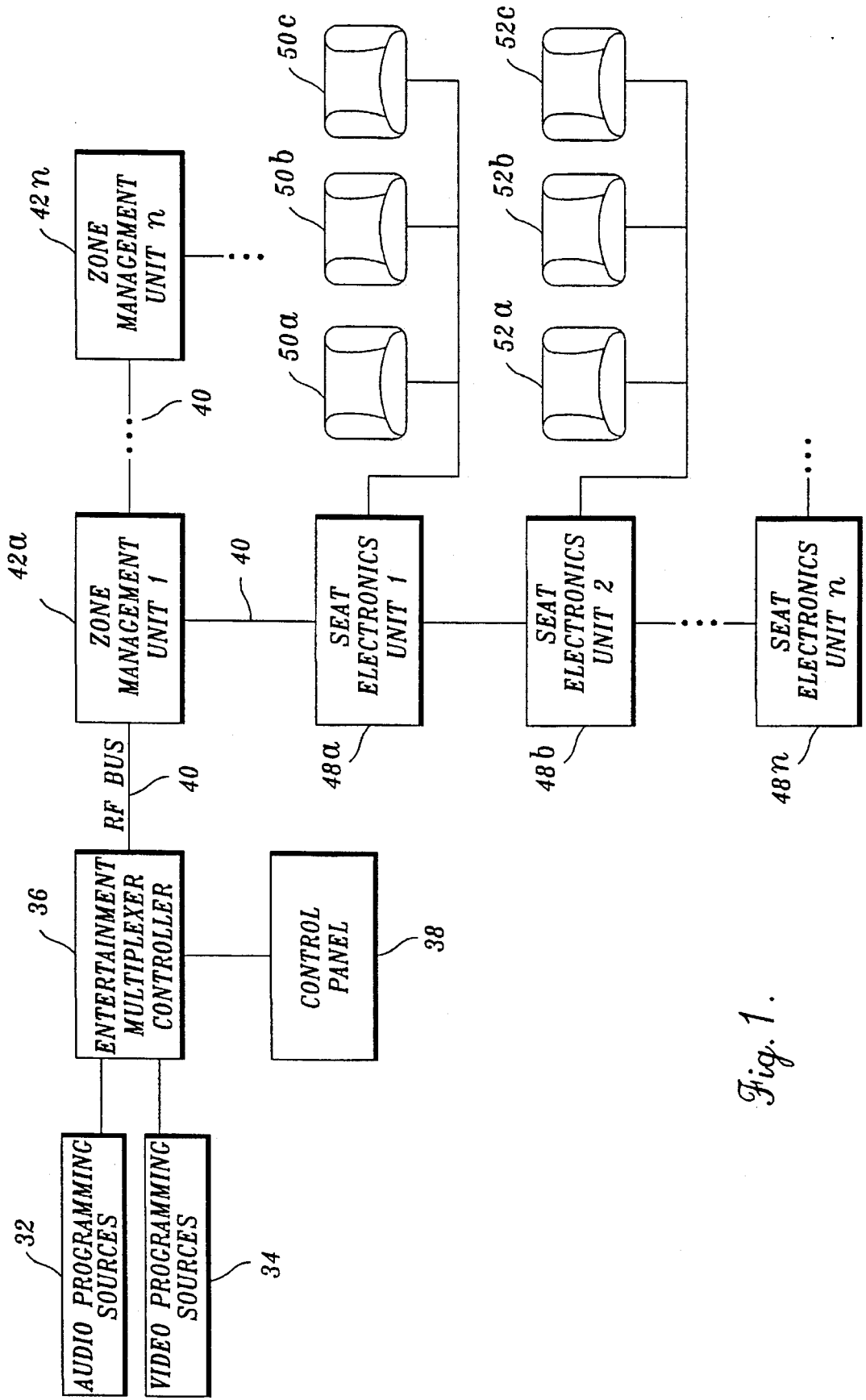
FIG. 1 is a block diagram of a passenger entertainment system suitable for incorporating a radio frequency (RF) bus leveling system formed in accordance with the present invention.

FIG. 1 is a block diagram of a passenger entertainment system 30 suitable for installation in a commercial aircraft. The passenger entertainment system provides signals from audio programming sources 32 and video programming sources 34 to each passenger in their individual seats. Representative audio programming may include material from compact disks, cassette tapes, or commercial broadcasts, and video programming may include material from video disks, video tapes, or commercial broadcasts. An entertainment multiplexer controller 36 is used to modulate signals from each audio or video programming source onto a different carrier signal. In a preferred embodiment of the invention, the modulated carrier signals have a frequency that fall within a radio frequency band that extends from 90 MHz to 360 MHz. Those skilled in the art will recognize that the number of channels of audio or visual programming that can be carried on a passenger entertainment signal is therefore limited by the bandwidth of each channel.

Entertainment multiplexer controller 36 also generates two sinusoidal pilot tones that are used by the passenger entertainment system to monitor and maintain the power level of the audio and video programming signals. In a preferred embodiment, the pilot tones are generated at approximately 90 MHz and 360 MHz. As will be discussed in greater detail below, the 90 MHz pilot tone is used to monitor and correct the overall power level of the audio and video programming signals. The 360 MHz pilot tone is used to monitor and correct for any nonlinearity of the attenuation across the multiple programming channels. While 90 MHz and 360 MHz pilot tones were selected for the preferred embodiment of the system, those skilled in the art will recognize that any other pilot tone frequencies within the operative bandwidth of the system can be selected.

The radio frequency carriers modulated with video and audio programming signals are combined by the entertainment multiplexer controller onto a single radio frequency (RF) bus 40. Throughout this description, a signal having one or more pilot tones and one or more carrier signals modulated by audio or video programming signals will be referred to as an "entertainment signal." Each carrier signal modulated by audio or video programming will be referred to as a "channel." The entertainment signal therefore carries a number of channels. A control panel 38 is provided to manipulate the content of the entertainment signal provided by the passenger entertainment system on the RF bus.

The entertainment signal is distributed to passengers on the aircraft by a network of zone management units 42a, 42b, ..., 42n, and seat electronics units 48a, 48b, ..., 48n that are connected to the RF bus. Each of the zone management units taps the entertainment signal on RF bus 40 and distributes the signal to a serial chain of seat cleotronic units. Branching from each of the seat electronics units is a bus that provides the entertainment signal to three passenger seats. For example, seat electronics unit 48a provides the signal to passenger seats 50a, 50b, and 50c and seat electronics unit 48b provides the signal to seats 52a, 52b and 52c. The passenger seats contain electronics for demodulating the video or audio programming signal from the cartier signal and to select between the multiple channels of audio and video programming. A passenger may then view the video programming on a television monitor, or listen to the audio programming using headphones connected to a receiver.

As the entertainment signal is transmitted through the passenger entertainment system on RF bus 40, the signal is attenuated. The RF attenuation is caused by the dielectric loss and resistance of the bus cabling, as well as the splitting of the signal by the zone management units and the seat electronics units. Those skilled in the an will recognize that the amount of attenuation will typically vary over the frequency range of the transmitted entertainment signal, with the high frequencies of the signal being attenuated more than the low frequencies of the signal. Since the preferred entertainment signal has a bandwidth from 90 MHz to 360 MHz, channels closer to 360 MHz will therefore be more attenuated than channels closer to 90 MHz. Generally, however, the amount of attenuation between these frequencies linearly varies over the entertainment signal bandwidth. Unless appropriately compensated for, the overall loss in signal amplitude leads to poor quality video or audio reproduction at the passenger seat.

To compensate for the attenuation that occurs during transmission of the entertainment signal, the present invention discloses a radio frequency bus leveling system. 60 (FIG. 2) that is designed to maintain the amplitude of the entertainment signal carried on the RF bus. In a preferred embodiment of the system, the bus leveling system is incorporated into the zone management units 42a, 42b, ... 42n, as well as the seat electronics units 48a, 48b ... 48n. The radio frequency bus leveling system is designed to maintain the level of the entertainment signal constant throughout the passenger entertainment system in order to minimize the effect of signal degradation. As will be better understood by the following description, bus leveling is accomplished by the bus leveling system monitoring the amplitude of one or moire components of the signal carried by the bus and adjusting the gain of a variable gain amplifier in a manner designed to compensate for signal degradation. While the invention is herein described in connection with an aircraft passenger entertainment system, those skilled in the an will appreciate that the bus leveling system described below could be used in any environment where the signal quality of a radio frequency signal carried on a transmission line needs to be maintained.

Figure 2:
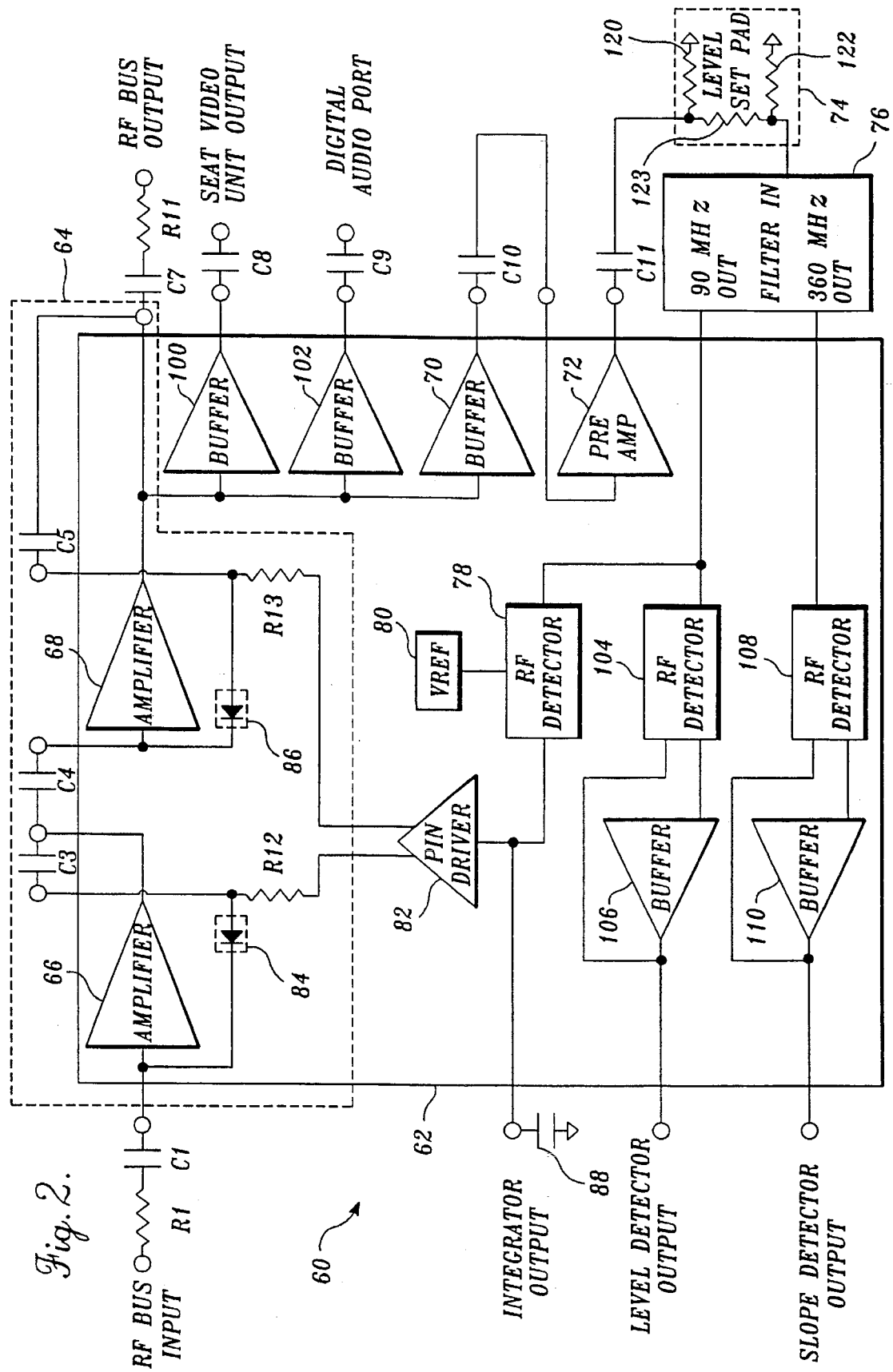
FIG. 2 is a block diagram of an RF bus leveling system formed in accordance with this invention.

FIG. 2 is a block diagram of radio frequency bus leveling system 60 formed in accordance with this invention. Preferably, much of the system circuitry illustrated in FIG. 2 and described below is incorporated into a single Application Specific Integrated Circuit (ASIC) 62. Unless otherwise noted, components represented within the ASIC block in FIG. 2 form part of the ASIC.

Figure 3:
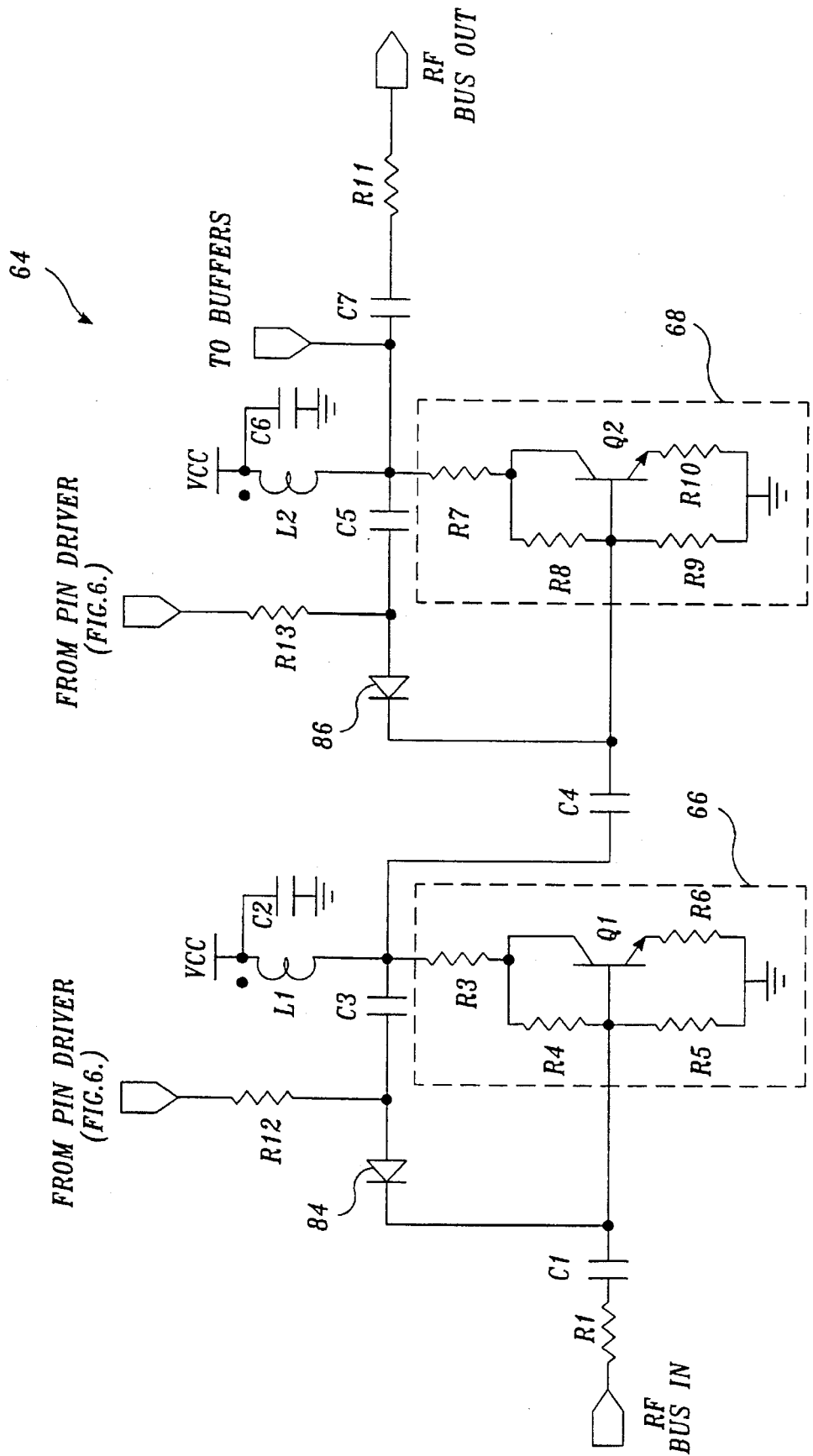
FIG. 3 is a schematic diagram of a two-stage variable gain amplifier suitable for use in the RF bus leveling system of FIG. 2.

Central to the operation of the bus leveling system is a two-stage variable gain amplifier (VGA) 64 that is connected in series with the RF bus 40. The construction of the two-stage variable gain amplifier 64 is shown in greater detail in the schematics of FIG. 3 and FIG. 4. In FIG. 3, a resistor designated R1 in series with a capacitor designated C1 connects the first stage of the VGA with the RF bus. R1 is sized to ensure impedance matching between the RF bus and the amplifier, while C1 is selected to remove any DC offsets in the incoming signal level.

The first stage of the VGA is constructed around a transistor amplifier 66. Illustrative circuitry for implementing amplifier 66 is provided in FIG. 4. Because the VGA is implemented on an ASIC, it will be appreciated that there are limitations on the circuit elements that may be used to construct the system components. For example, multiple transistors must often be connected in parallel to generate the desired operating currents. In an actual embodiment of the invention, the bus leveling system was implemented on a Maxim Quickchip 640 linear array and packaged in a Mini-systems 136 pin flatpack package. Those skilled in the art will recognize that other integrated circuit processes and packages could be used to implement the circuit of the present invention.

Figure 4:
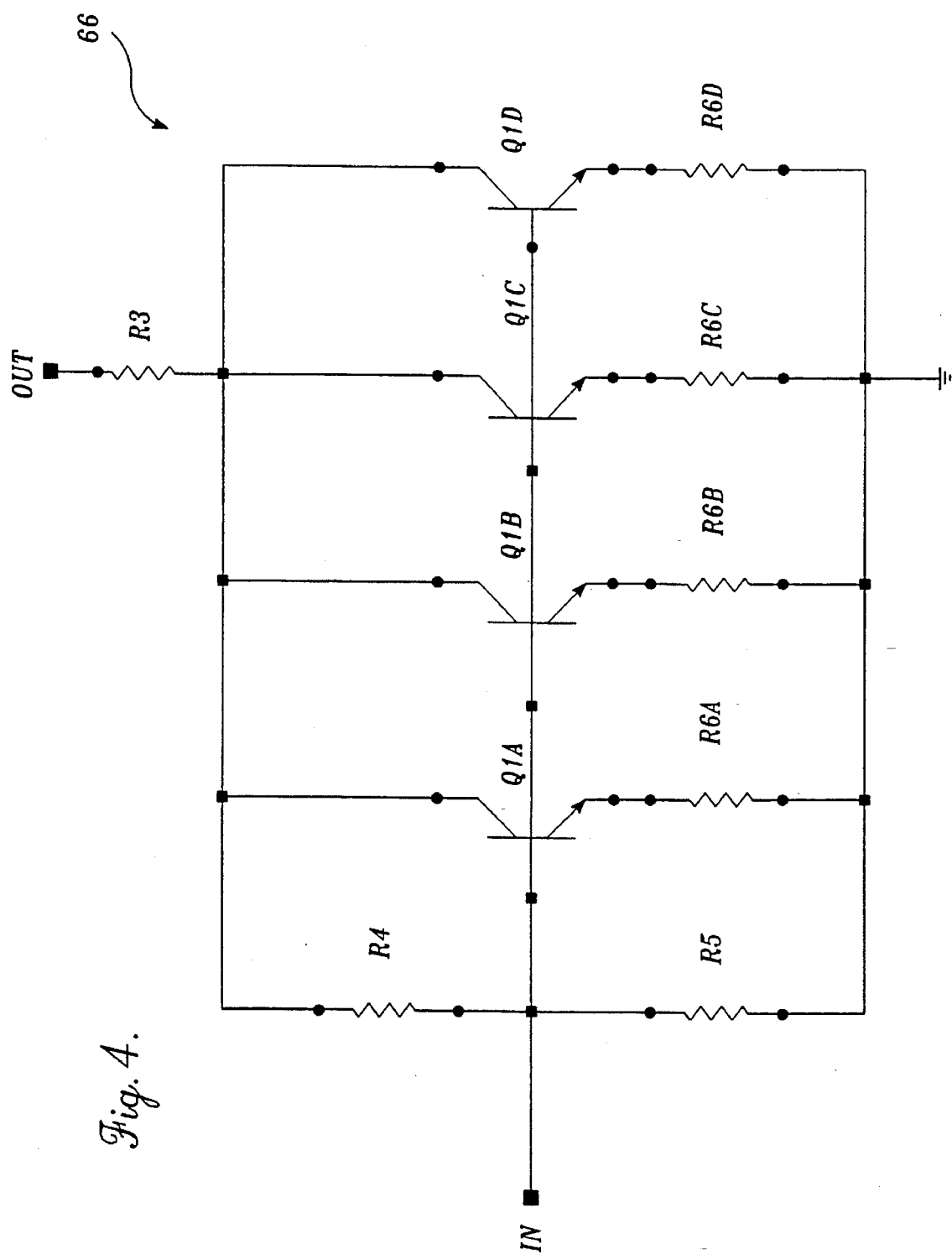
FIG. 4 is a schematic diagram of one of the amplifier stages suitable for use in the two-stage variable gain amplifier of FIG. 3.

As shown in FIG. 4, amplifier 66 is composed of four BJT transistors designated Q1A, Q1B, Q1C, and Q1D, that are connected in parallel. The collectors of the four transistors are tied together and to one end of a resistor designated R3. The other end of R3 forms an output for amplifier 66. The emitters of Q1A, Q1B, Q1C and Q1D are each connected to ground through an emitter bias resistor designated R6A, R6B, R6C, or R6D, respectively. The emitter series bias resistance is distributed equally among the four transistors to ensure equal sharing of collector current among the transistors. The bases of Q1A, Q1B, Q1C, and Q1D are tied together and connected by a resistor designated R5 to ground and by a resistor designated R4 to the transistor collectors. Resistors R4 through R6 set the DC operating point of amplifier 66, and help to match the input to the impedances of the RF bus (50 ohm in an actual embodiment of the invention) and set the maximum open loop gain. The series feedback provided by R6A, R6B, R6C, and R6D makes the bias current fairly insensitive to transistor beta, operating temperature, and power supply variations, while R3 improves the stability of the circuit. Those skilled in the art will recognize that in operation, a DC biasing voltage is applied at the output of the amplifier in order to bias the transistors. An AC signal that is then applied to the input of amplifier 66 will be amplified by the open-loop gain of the amplifier and will appear at the output of the amplifier.

Returning to FIG. 3, the gain of amplifier 66 is limited by a series feedback circuit formed by a capacitor designated C3 and a PIN diode 84 connected between the output and input of amplifier 66. Connected between C3 and the PIN diode 84 of the feedback loop is one end of a resistor designated R12. The other end of R12 is connected to a PIN driver, illustrated in FIG. 6 and described below. The gain of the first-stage of the VGA may be adjusted by injection of current through R12 into the, feedback loop of amplifier 66. The injection of current varies the resistance of the PIN diode 84, adjusting the amount of resistance in the feedback path and therefore the closed loop gain produced by the first stage of the VGA. The injection of current also slightly shifts the transistors' DC bias, causing the first-stage of the VGA to draw more DC current at the lower gain settings. The increased DC current at the lower gain settings helps compensate for the inherent decrease in linearity that is caused by decreasing the feedback resistance to lower the gain, and results in an amplifier with almost constant linearity versus gain setting. In an actual embodiment of the invention, the chosen PIN diode 84 was an HPND-0001, manufactured by Hewlett Packard. The PIN diode is located off the ASIC wafer, but is included within the hybrid package. Those skilled in the art will recognize that other PIN diodes or variable resistance devices could be substituted in place of the chosen PIN diode.

The output from the first-stage of VGA 64 is connected to the second-stage of the VGA by a coupling capacitor designated C4, which removes any DC offset. The second stage of the VGA consists of an amplifier 68 having a capacitor designated C5 and a PIN diode 86 connected in a feedback loop between the output and the input of the amplifier. Amplifier 68 is identical in construction to amplifier 66, except the values of the resistors in the amplifier vary slightly.

The open loop gain of amplifier 68 is limited by the feedback connection of C5 and the PIN diode 86. One end of a resistor designated R13 is connected to the juncture between C5 and the PIN diode 86. The other end of R13 is connected to the PIN driver illustrated in FIG. 6 and described below. In the same manner as the first-stage of the VGA, the gain of the second-stage is controlled by the injection of current into the feedback loop of amplifier 68. The injection of current varies the resistance of the PIN diode 86, adjusting the resistance of the feedback path and therefore the amount of closed loop gain produced by the second stage. The injection of current also slightly shifts the transistors' DC bias, to help compensate for the inherent decrease in linearity that is caused by decreasing the feedback resistance to lower the gain. In an actual embodiment of the invention, the chosen PIN diode 86 was an HPND-0001, manufactured by Hewlett Packard. The PIN diode is located off the ASIC, but is contained within the hybrid package. The output from amplifier 68 is connected to the RF bus by a coupling capacitor designated C7 and a resistor designated R11. C7 removes any DC offset, and R11 matches the output impedance of bus leveling system 60 with that of the RF bus.

FIG. 3 also shows the power supply connection of the first- and secondstage of the VGA. An external voltage designated VCC is connected to each of the amplifier stages through an inductor designated L1 and L2, respectively. L1 and L2 allow DC bias current to flow to the collectors of Q1 and Q2, but block the flow of signal current thereby increasing the efficiency of the amplifier versus the resistive collector bias. Capacitors C2 and C6 are attached between the power supply and ground to provide power supply decoupling.

In summary, an entertainment signal input into two-stage variable gain amplifier 64 is amplified and output over the RF bus. The amount of amplification provided by the variable gain amplifier is dependent upon the amount of current that is injected through R12 and R13 from a PIN driver circuit. In an actual embodiment of the invention, variable gain amplifier 64 can be adjusted to provide approximate amplification from −10 dB to +20 dB.

Returning to FIG. 2, the bus leveling system 60 contains a control circuit to monitor and maintain the appropriate amplitude of the entertainment signal by adjusting the gain of the two-stage variable gain amplifier. The control circuit consists of a buffer 70, a preamplifier 72, a level set pad 74, a filter 76, an RF detector 78, a voltage reference 80, and a PIN driver 82. The operation of these components, which produce a control loop that monitors and automatically adjusts the gain of the VGA, are individually discussed below.

The buffer 70 is connected to the second-stage of VGA 64 to provide a high impedance tap from the output of the two-stage amplifier. In an actual embodiment of the invention, the buffer 70 comprises a Darlington transistor pair that is capacitively coupled to the RF bus. The buffer provides a gain of approximately −6.0 dB; and an isolation of approximately 60 dB, while not loading the output of the RF bus. Those skilled in the art will recognize that many different circuits can be used to create a suitable buffer for isolating the RF bus and subsequent control loop stages in ASIC 62.

A capacitor designated C10 connects the output of the buffer 70 to the preamplifier 72. C10 is sized to remove any DC offset that is generated by the buffer. The preamplifier 72 is inserted between the buffer 70 and the remaining control circuits in order to overcome insertion losses in later stages, and also to decrease the effects of any transistor $V_{be}$ mismatches that are present in subsequent stages of the control loop. The preamplifier 72 is designed to boost the entertainment signal level approximately 15 dB, without introducing distortion. In an actual embodiment of the invention, the preamplifier consists of two AC coupled gain stages followed by a direct coupled output stage. The first AC coupled stage has a single ended input and a differential output while the second AC coupled stage has a differential input and a single ended output. The output stage consists of a Darlington transistor pair. Those skilled in the art will recognize that the preamplifier design can be varied, as long as it provides sufficient amplification to drive subsequent control circuits and the gain is fairly temperature insensitive.

After the entertainment signal has been buffered by the buffer 70 and amplified by the preamplifier 72, the signal is input to the level set pad 74 through a capacitor designated C11. C11 decouples the preamplifier from the level set pad, and removes any DC offset. The level set pad 74 is a voltage divider whose components are selected to attenuate the amplitude of the entertainment signal to a desired level. The level set pad has three resistors, a first resistor 120 tied between the input to the level set pad and ground, a second resistor 122 tied between the output of the level set pad and ground, and a third resistor 123 connected between the input and the output. The level set pad attenuates the amplitude of the entertainment signal to a desired signal level. Adding attenuation raises the output signal level of the entertainment signal, as the control circuit adjusts the gain of the variable gain amplifier to compensate for the apparent reduced signal level. In an actual embodiment of the invention, the resistance of the first, second and third resistors are selected to set the amplitude of the entertainment signal at the RF bus output to approximately −29.0 dBm.

The combination of the buffer, pre-amplifier, and level set pad adjust the amplitude of the entertainment signal for subsequent manipulation. The purpose of the remaining control circuitry is to filter a pilot tone from the entertainment signal, and compare the amplitude of the pilot tone with a voltage reference that is representative of the desired amplitude of the signal. Based on the comparison results, the variable gain of the two-stage amplifier is adjusted until the amplitude of the pilot tone is equal to the desired amplitude of the output signal.

The attenuated entertainment signal is input into the filter 76. The filter 76 is a bandpass filter that passes the pilot tones contained within the entertainment signal while removing the audio and video channels of the signal. In a preferred embodiment of the system, the filter 76 passes the 90 MHz and 360 MHz pilot tones contained in the entertainment signal. In an actual embodiment of the system, the filter 76 is a passive LC bandpass filter that has a −3 dB bandwidth of 6 MHz around each of the pilot tone frequencies. Around the lower frequency pilot tone, the rejection of the filter is −30 dB at 30 MHz and 130 MHz.

The 90 MHz output of the filter 76 is connected to the RF detector 78. The RF detector 78 compares the amplitude of the 90 MHz pilot tone with a voltage reference level that is generated by the voltage reference 80. In an actual embodiment of the invention, the reference voltage is generated by a Brokaw bandgap. Those skilled in the art will recognize that many different bandgap designs could be used to generate a constant reference voltage. In the actual embodiment of the invention, the bandgap cell was configured to produce an 18.2 mV DC reference voltage for input into PdF detector 78.

Figure 5:
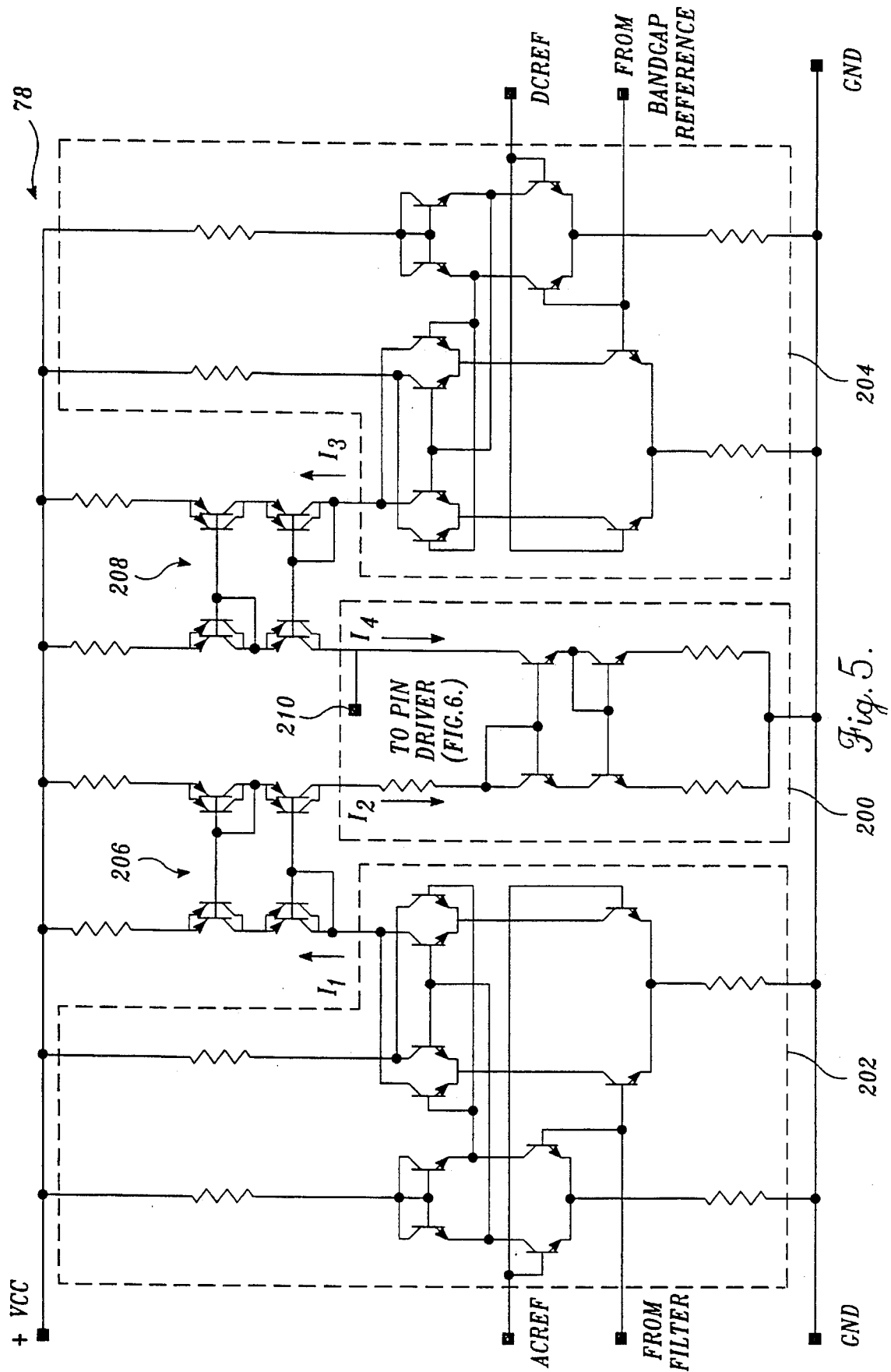
FIG. 5 is a schematic diagram of an RF detector suitable for use in the RF bus leveling system of FIG. 2.

FIG. 5 shows illustrative circuitry for implementing the RF detector 78. The RF detector is composed of two identical four-quadrant analog multipliers, or Gilbert multipliers 202 and 204, that are coupled to a current comparator 200. Those skilled in the art will recognize that Gilbert multipliers multiply two input signals together to generate an output signal indicative of the linear product of the input signals. In a preferred embodiment of the invention, one of the Gilbert multipliers 202 is used to generate a current proportional to the amplitude of the 90 MHz pilot tone. The 90 MHz pilot tone received from the filter is connected to one input of the Gilbert multiplier 202. The second input of the Gilbert multiplier 202, labeled ACREF, is tied to ground through a resistor (not shown). This multiplier configuration squares the pilot tone signal, rectifying the signal and producing a current $I_1$ through a current mirror 206. The current mirror 206 mirrors current $I_1$ to produce a load current $I_2$ that is applied to the left-hand side of the current comparator 200 shown in FIG. 5. Due to the relatively slow response time of the current mirror 206, the load current $I_2$ is a filtered representation of current $I_1$, and is proportional to the RMS value of the full wave rectified pilot tone.

The second Gilbert multiplier 204 is used to generate a reference current level. One input of the second Gilbert multiplier 204 is connected to the bandgap reference, and the second input of the multiplier, labeled DCREF, is connected to ground (not shown). The application of the bandgap reference voltage to the second Gilbert multiplier produces a current $I_3$ in a current mirror 208. The current mirror 208 mirrors current $I_3$ to produce a reference current $I_4$ that is applied to the right-hand side of the current comparator 200, shown in FIG. 5. The current comparator compares the value of the load current $I_2$, which is proportional to the RMS value of the 90 MHz pilot tone, with the value of the reference current $I_4$, which is proportional to the bandgap reference voltage. If the load current $I_2$ is less than the reference current 14, excess current will be provided to a node 210. If the load current $I_2$ is greater than the reference current 14, then current is drained from the node 210. Any excess or shortfall of current produced at node 210 is hereinafter referred to as a "control current."

Returning to FIG. 2, the control current from the RF detector 78 is applied to an integrator capacitor 88, producing a voltage level that is applied to PIN driver 82. The integrator capacitor 88 limits the skew rate of the signal coming from the RF detector. That is, the integrator capacitor charges or discharges slowly in order to reduce the feedback rate of the control circuit and avoid undesired oscillations. In an actual embodiment of the system, the integrator capacitor 88 is selected to set the loop response time to approximately 10 milliseconds.

Figure 6:
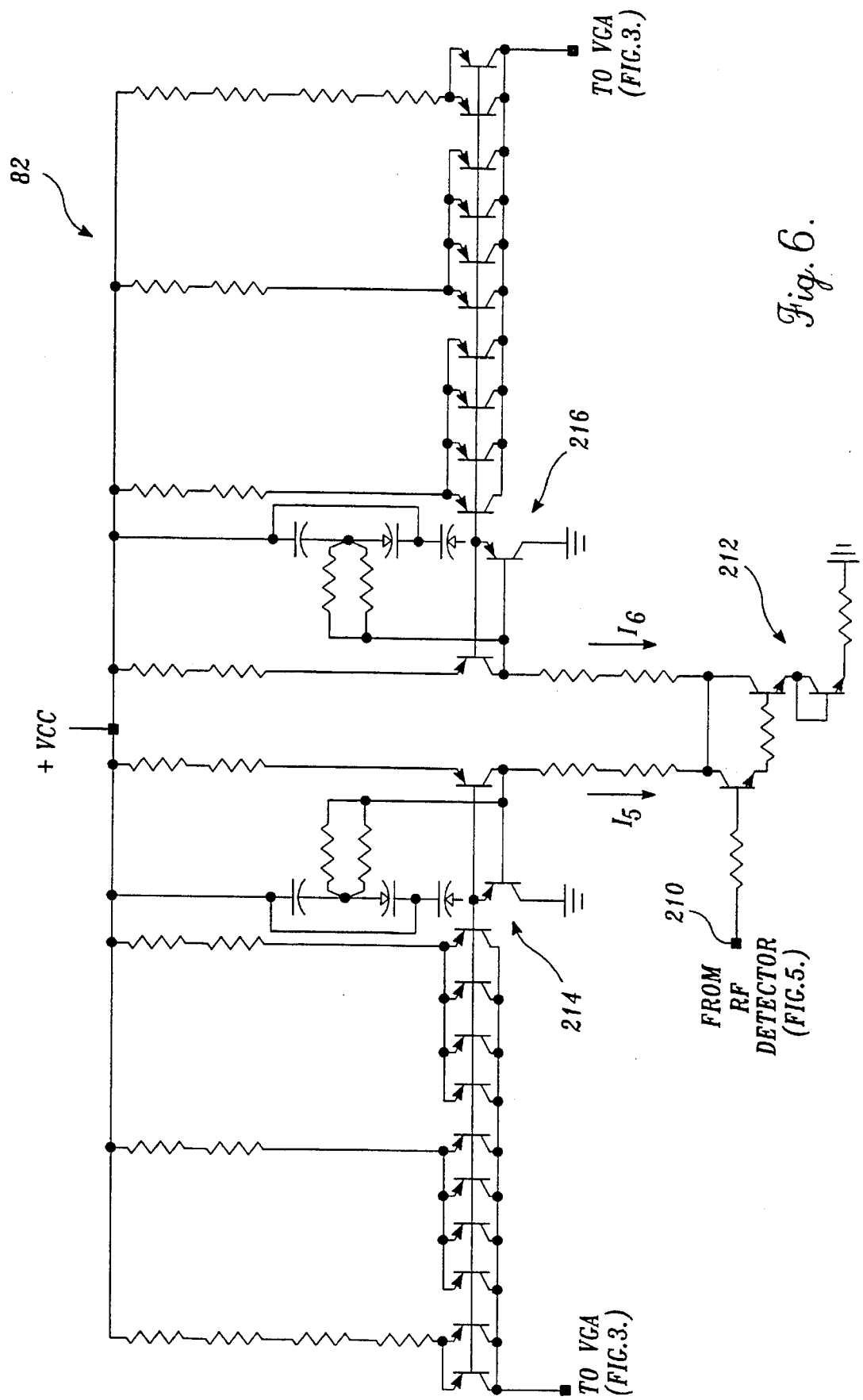
FIG. 6 is a schematic diagram of a PIN driver that provides a control signal to the two-stage variable gain amplifier of the RF bus leveling system of FIG. 2.

The PIN driver 82 is connected to the feedback loops of the first and second stables of the variable gain amplifier 64 by resistors K12 and K13. The purpose of the PIN driver is to inject sufficient current in the feedback loops to adjust the resistance of the PIN diodes, varying the gain that is produced by the two-stage variable gain amplifier 64. Illustrative PIN driver circuitry is shown in the schematic of FIG. 6. The voltage across the integrator capacitor is provided to the PIN driver at node 210. Based on the voltage level at node 210, a Darlington input-voltage-to-constant-current converter 212 produces two reference currents $I_5$ and $I_6$. Each reference current drives one end of a current mirror. In an actual embodiment of the invention, a first current mirror 214 is provided to drive one stage of VGA 64, and a second mirror 216 is provided to drive the second stage of the VGA. Reference currents $I_5$ and $I_6$ are mirrored by a parallel combination of ten transistors, which boost the currents to a level sufficient to adjust the resistance of the PIN diodes. Each of the current mirrors injects a control current to a different stage of the variable gain amplifier, adjusting the overall gain that is generated by the amplifier. In an actual embodiment of the invention, each current mirror in the PIN driver is capable of providing up to a 1.5 mA current to the respective VGA stage.

In conjunction with the two-stage variable gain amplifier, the control circuit just described maintains the amplitude of an entertainment signal carded on the bus at a desired level. ASIC 62 contains the majority of the bus leveling system components. With the exception of the PIN diodes, all of the components of the two stage variable gain amplifier 64 are contained in the ASIC. Of the control circuit, which includes the buffer 70, the preamplifier 72, the level set pad 74, the filter 76, the RF detector 78, and the PIN driver 82, only the level set pad and the filter are not contained in ASIC 62.

In an actual embodiment of the invention, ASIC 62 contains additional circuits that monitor and distribute the entertainment signal. The additional circuits include two buffers 100 and 102 that are connected to the output of the variable gain amplifier. Buffers 100 and 102 act as active splitters to provide RF power taps from the RF bus without causing a significant power loss on the bus. One buffer 100 provide a distribution to a seat video receiver through a decoupling capacitor designated C8. The other buffer 102 provides distribution to a seat audio receiver through a decoupling capacitor designated C9.

Figure 7:
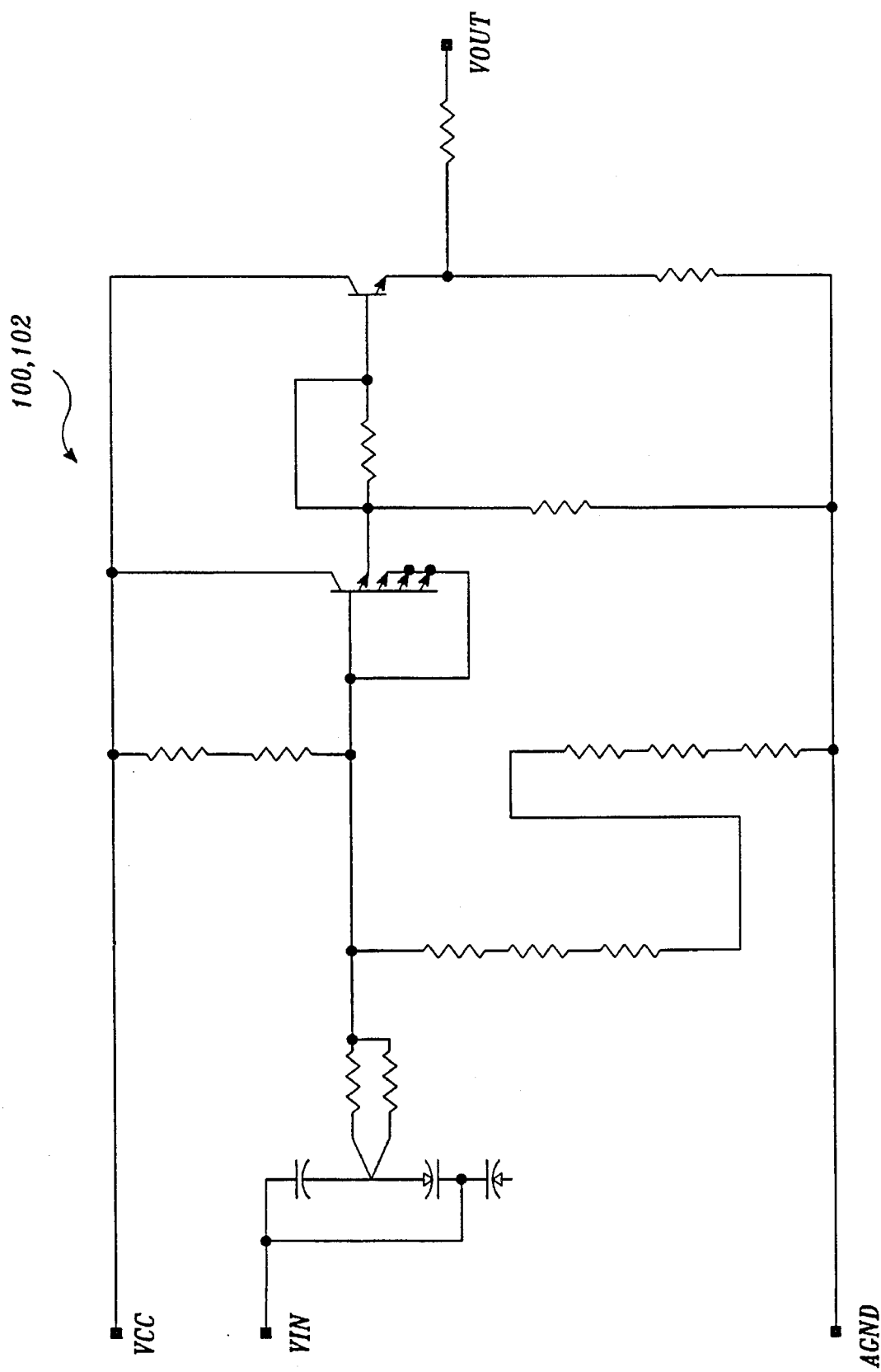
FIG. 7 is a schematic diagram of a buffer that provides a tap from the output of the two-stage variable gain amplifier in the RF bus leveling system of FIG. 2.

FIG. 7 shows illustrative circuitry for implementing buffers 100 and 102. Each buffer consists of a Darlington transistor pair, bias resistors, input coupling capacitor, and a series output resistor. The buffers have a high input impedance to avoid loading the RF bus, yet provide a 50 ohm output impedance at the power levels required by the seat audio and video receivers. The buffers also provide a high level of isolation between the seat audio and video receivers and the RF bus, which prevents interference signals in the seat audio and video receivers from coupling onto the RF bus.

ASIC 62 also contains circuitry for producing two detector output signals that are proportional to the amplitude of the 90 MHz and 360 MHz pilot tones. The detector output signals allow a microprocessor contained within the passenger entertaimnent system to condition the entertainment signal beyond the amplification provided by the bus leveling system. As shown in FIG. 2, the 90 MHz pilot tone output of the filter 76 is input into a first RF detector 104. The first RF detector 104 is almost identical in construction to the previously described RF detector 78, having two Gilbert multipliers connected to a current comparator through two current mirrors. One Gilbert multiplier squares the 90 MHZ pilot tone to produce a load current in the current comparator proportional to the RMS rectified voltage of the pilot tone. The other Gilbert multiplier receives a feedback signal from the output of a buffer 106 connected to the first RF detector 104. A difference in voltage between the pilot tone and the feedback signal generates a current, which charges or discharges an integrating capacitor (not shown) contained in the buffer 106. The buffer 106 is a high gain differential amplifier that amplifies the voltage produced across the integrating capacitor. The scaled output from the buffer 106 is connected back to the RF detector 104, producing a feedback path that forces the integrating capacitor to charge if the fed back voltage is less than the RMS equivalent voltage of the 90 MHz pilot tone, and discharge if the fed back voltage is greater than the RMS equivalent voltage of the 90 MHz pilot tone. The level detector output therefore generates a DC voltage that is proportional to the average amplitude of the lower frequency pilot tone.

Similarly, a second RF detector 108 and buffer 110 are provided to generate a DC voltage that is proportional to the higher frequency pilot tone. The second RF detector 108 and buffer 110 operate in the same manner as the first RF detector 104 and buffer 106. Instead of generating a voltage proportional to the 90 MHz pilot tone, however, the second RF detector 108 and buffer 110 generate a DC voltage proportional to the amplitude of the 360 MHz pilot tone received from the filter 76. Those skilled in the art will recognize that the 360 MHz pilot tone will typically be more attenuated by transmission in the passenger entertainment system than the 90 MHz pilot tone.

The purpose of the 360 MHz tone is to allow external components in the passenger entertainment system to compensate for unequal attenuation over the spectrum of the entertainment signal. That is, since the 360 MHz signal is typically attenuated to a greater degree than the 90 MHz signal, other system components may be used to adjust the amplitude of the bus signal so that higher frequencies are amplified more than lower frequencies. An estimate of the appropriate amplification to provide may be made by linearly interpolating between the attenuation of the entertainment signal at 90 MHz and at 360 MHz.

It will be appreciated that a radio frequency bus leveling system 60 formed in accordance with the present invention offers many advantages over the prior art. Most importantly, the incorporation of the majority of the system components onto a single ASIC 62 ensures that the amplitude leveling is unaffected by changes in operating conditions. The use of two Gilbert multipliers within RF detector 78 ensures that each of the Gilbert multipliers will be equally affected by any changes in power supply voltage or temperature. Any errors that arise due to slight process variation between ASICs should also cancel each other out. Since both Gilbert multipliers are equally affected by operating condition changes, the comparison of the amplitude of the pilot tone with the reference voltage will remain highly accurate.

Additionally, the use of PIN diodes as variable resistance elements in the variable gain amplifier stages produces an amplifier having a lower noise figure, greater linearity over a larger dynamic range, and higher power efficiency compared with prior art systems. Prior art leveling systems use variable attenuators in from of fixed gain amplifiers for leveling of signal amplitude. The use of PIN diodes in the feedback path of the variable gain amplifier to control the gain results in a lower noise figure and higher linearity at lower gain settings than prior discrete systems.

Still another advantage is provided by the use of buffer amplifiers as active splitters to tap the entertainment signal from the RF bus, rather than relying on a passive splitter. The use of active splitters allows smaller power amplifier stages to be used for the variable gain amplifier, and allows the variable gain amplifier to be implemented on a single ASIC. If passive splitters were used, additional power amplifiers would be required to compensate for the power lost in the splitters.

While the presently preferred embodiment of the invention has been illustrated and described, it will be appreciated that various changes can be made therein without departing from the spirit and scope of the invention. Those skilled in the art will recognize that while a pilot tone is currently used to monitor the level of the entertaimnent signal, the signal level could be monitored in other ways. For example, one of the channels of the entertainment signal may inherently contain a component that could be filtered from the entertainment signal and used to determine the overall signal level. Alternatively, a relatively constant entertainment channel signal could be directly input into the RF detector to provide a measure of the RMS average voltage on the particular channel. Either method will be effective if the resulting component or signal is indicative of the entertainment signal amplitude. Using alternative measures of the signal amplitude could entail redesign or omission of the filter 76.

While it is an advantage of the present invention to incorporate all of the system components onto a single ASIC, it will also be appreciated that several of the components could be removed from the integrated circuit. For example, the buffer 70 or the preamplifier 72 could easily be incorporated as external circuits. Their incorporation in the integrated circuit, however, reduces the overall power consumption and the space occupied by the bus leveling system.

Those skilled in the art will further appreciate that the present invention can be implemented using bipolar processes other than the one disclosed herein. Alternate bipolar processes may be selected in order to optimize circuit operation depending upon desired system linearity, noise requirements, and gain/bandwidth. Consequently, within the scope of the appended claims it will be appreciated that the invention can be practiced otherwise than as specifically described herein.

We claim:

1. A system for maintaining the amplitude of a signal carded on a bus, the signal including at least one carder modulated with data and a component indicative of the amplitude of the signal, the system comprising:

(a) a variable gain amplifier having an input and an output that are connected in series with the bus, the variable gain amplifier comprising an amplifier, a PIN diode connected in a feedback path from the output of the amplifier to the input of the amplifier, and a control input coupled to the feedback path, wherein a control signal provided to the control input varies the resistance of the PIN diode to adjust the gain produced by the variable gain amplifier;

(b) a filter coupled to the output of the variable gain amplifier for filtering the signal carried on the bus to isolate the component of the signal that is indicative of the amplitude of the signal;

(c) a voltage reference for producing a reference voltage level; and (d) a detector coupled to the filter and to the control input of the variable gain amplifier for comparing the amplitude of the component of the signal with the reference voltage level and providing a control signal to the control input of the variable gain amplifier to bring the amplitude of the component equal to the reference voltage level, the detector comprising:

(i) a first multiplier coupled to the filter for receiving the component of the signal indicative of the amplitude of the signal and generating a load current proportional to the amplitude of the component;

(ii) a second multiplier coupled to the voltage reference for generating a reference current proportional to the reference voltage level; and (iii) a current comparator coupled to the first and second multipliers for comparing the load current with the reference current and producing a control signal proportional to the difference between the load current and the reference current.

2. The system of claim 1, wherein the amplifier, the voltage reference, and the detector are incorporated into an Application Specific Integrated Circuit (ASIC).

3. The system of claim 2, wherein the voltage reference is a bandgap reference.

4. The system of claim 3, further comprising a PIN driver coupled between the detector and the variable gain amplifier for receiving the control signal generated by the detector and amplifying the control signal to provide sufficient current to vary the resistance of the PIN diode and adjust the gain produced by the variable gain amplifier.

5. The system of claim 4, wherein the variable gain amplifier further composes a second amplifier having a PIN diode connected in a feedback path from the output of the second amplifier to the input of the second amplifier, and a control input coupled to the feedback path such that a control signal applied to the control input varies the resistance of the PIN diode to adjust the gain of the variable gain amplifier.

6. The system of claim 5, wherein the PIN driver provides a second control signal to the second amplifier to vary the resistance of the PIN diode in the feedback path of the second amplifier in order to adjust the gain produced by the variable gain amplifier.

7. The system of claim 6, further comprising a buffer coupled between the output of the variable gain amplifier and the filter.

8. The system of claim 7, further comprising a resistor network coupled between the buffer and the filter for attenuating the signal to a desired level.

9. The system of claim 1, wherein the signal is a radio frequency signal.

10. The system of claim 9, wherein the component indicative of the amplitude of the signal is a pilot tone.

11. The system of claim 1, wherein the first and second multipliers are Gilbert multipliers.

12. The system of claim 1, further comprising a buffer coupled to the output of the variable gain amplifier, the buffer providing an active tap of the signal carded on the bus.

13. A system for maintaining the amplitude of a signal carded on a bus, the signal including at least one carder modulated with data and a pilot tone indicative of the amplitude of the signal, the system comprising:

(a) a variable gain amplifier having an input and an output that are connected in series with the bus, and a control input, a gain produced by the variable gain amplifier adjusted in response to a control signal provided to the control input;

(b) a filter coupled to the output of the variable gain amplifier for filtering the signal carded on the bus to isolate a pilot tone from the signal;

(c) a voltage reference for producing a reference voltage; and (d) a detector coupled to the filter, the voltage reference and the control input of the variable gain amplifier, the detector comprising:

(i) a first Gilbert multiplier coupled to the filter for receiving the pilot tone and generating a load current proportional to the amplitude of the pilot tone;

(ii) a second Gilbert multiplier coupled to the voltage reference for generating a reference current proportional to the reference voltage level; and (iii) a current comparator coupled to the first and second Gilbert multipliers for comparing the load current with the reference current, producing a control signal proportional to the difference between the load current and the reference current, and providing the control signal to the control input of the variable gain amplifier in order to adjust the gain of the variable gain amplifier so that the pilot tone is maintained at a desired amplitude.

14. The system of claim 13, wherein the variable gain amplifier comprises:

(a) an amplifier having an input and an output; and (b) a PIN diode connected in a feedback path from the output of the amplifier to the input of the amplifier, wherein the control input of the variable gain amplifier is coupled to the feedback path so that a control signal received on the control input varies the resistance of the PIN diode.

15. The system of claim 14, wherein the amplifier and the detector are incorporated into an Application Specific Integrated Circuit (ASIC).

16. The system of claim 15, wherein the voltage reference is a bandgap reference.

17. The system of claim 14, further comprising a PIN driver coupled between the detector and the variable gain amplifier, said PIN driver receiving the control signal generated by the detector and amplifying the control signal to provide sufficient current to vary the resistance of the PIN diode and adjust a gain produced by the variable gain amplifier.

18. The system of claim 17, wherein the variable gain amplifier further comprises a second amplifier having a PIN diode connected in a feedback path from an output of the second amplifier to an input of the second amplifier, and a control input coupled to the feedback path such that a control signal applied to the control input varies the resistance of the PIN diode to adjust the gain of the variable gain amplifier.

19. The system of claim 18, wherein the PIN driver provides a second control signal to the second amplifier to vary the resistance of the PIN diode in the feedback path of the second amplifier in order to adjust the gain produced by the variable gain amplifier.

20. The system of claim 19, further comprising a buffer coupled between the output of the variable gain amplifier and the filter.

21. The system of claim 20, further comprising a resistor network coupled between the buffer and the filter for attenuating the signal to a desired level.

22. The system of claim 17, wherein the amplifier, the voltage reference, the detector, and the PIN driver are incorporated into an Application Specific Integrated Circuit (ASIC).

23. The system of claim 13, wherein the signal is a radio frequency signal.

24. The system of claim 13, further comprising a buffer coupled to the output of the variable gain amplifier, the buffer providing an active tap of the signal carried on the bus.

25. A system for maintaining the amplitude of a signal carded on a bus, the signal including at least one carrier modulated with data and a component indicative of the amplitude of the signal, the system comprising:
  (a) a PIN diode; and
  (b) a leveler incorporated in an Application Specific Integrated Circuit (ASIC) comprising:
    (i) a variable gain amplifier having an input and an output that are connected in series with the bus, the variable gain amplifier comprising an amplifier with the PIN diode connected in a feedback path from the output of the amplifier to the input of the amplifier, and a control input coupled to the feedback path, wherein a control signal provided to the control input varies the resistance of the PIN diode to adjust the gain produced by the variable gain amplifier;
    (ii) a voltage reference for producing a reference voltage level; and
    (iii) a control circuit coupled to the output of the variable gain amplifier, the voltage reference, and the control input of the feedback path, the control circuit comparing the amplitude of a component of the signal carried on the bus with the reference voltage level and adjusting the gain of the variable gain amplifier to maintain the component of the signal at a desired amplitude.

26. The system of claim 25, further comprising a filter coupled to the output of the variable gain amplifier for filtering the signal carried on the bus to isolate the component of the signal that is indicative of the amplitude of the signal.

27. The system of claim 26, wherein the control circuit comprises a detector coupled to the filter and to the control input of the variable gain amplifier for comparing the amplitude of the component: of the signal with the reference voltage level and providing a control signal to the control input of the variable gain amplifier to bring the amplitude of the component equal to the reference voltage level.

28. The system of claim 27, wherein the voltage reference is a bandgap reference.

29. The system of claim 28, wherein the detector comprises:
  (a) a first multiplier coupled to the filter for receiving the component of the signal indicative of the amplitude of the signal and generating a load current proportional to the amplitude of the component;
  (b) a second multiplier coupled to the voltage reference for generating a reference current proportional to the reference voltage level; and
  (c) a current comparator coupled to the first and second multipliers for comparing the load current with the reference current and producing a control signal proportional to the difference between the load current and the reference current.

30. The system of claim 29, wherein the first and second multipliers are Gilbert multipliers.

31. The system of claim 30, wherein the leveler further comprises a PIN driver coupled between the detector and the variable gain amplifier for receiving the control signal generated by the detector and amplifying the control signal to provide sufficient current to vary the resistance of the PIN diode and adjust the gain produced by the variable gain amplifier.

32. The system of claim 31, wherein the variable gain amplifier further comprises a second amplifier having a PIN diode connected in a feedback path from the output of the second amplifier to the input of the second amplifier, and a control input coupled to the feedback path such that a control signal applied to the control input varies the resistance of the PIN diode to adjust the gain of the variable gain amplifier.

33. The system of claim 32, wherein the PIN driver provides a second control signal to the second amplifier to vary the resistance of the PIN diode in the feedback path of the second amplifier in order to adjust the gain produced by the variable gain amplifier.

* * * * *

UNITED STATES PATENT AND TRADEMARK OFFICE
CERTIFICATE OF CORRECTION

PATENT NO. : 5,546,050  
DATED : August 13, 1996  
INVENTOR(S) : M.H. Florian et al.

Page 1 of 2

It is certified that error appears in the above-indentified patent and that said Letters Patent is hereby corrected as shown below:

On the title page, item

| [57] | Abstract | "carded" should read --carried-- |

| [57] | Abstract | "RE" should read --RF-- |
| Column | line | |
| 12 (Claim 1, line 2) | 56 | "carded" should read --carried-- |
| 12 (Claim 1, line 2) | 56 | "carder" should read --carrier-- |
| 13 (Claim 5, line 2) | 38 | "composes" should read --comprises-- |
| 13 (Claim 12, line 3) | 63 | "carded" should read --carried-- |
| 13 (Claim 13, line 2) | 65 | "carded" should read --carried-- |
| 13 (Claim 13, line 2) | 65 | "carder" should read --carrier-- |
| 14 (Claim 13, line 11) | 7 | "carded" should read --carried-- |

UNITED STATES PATENT AND TRADEMARK OFFICE
CERTIFICATE OF CORRECTION

PATENT NO. : 5,546,050

DATED : August 13, 1996

INVENTOR(S) : M.H. Florian et al.

It is certified that error appears in the above-indentified patent and that said Letters Patent is hereby corrected as shown below:

COLUMN     LINE

15     12     "carded" should read --carried--
(Claim 25, line 2)

16     1     After "component" delete --:--
(Claim 27, line 4)

Signed and Sealed this

Seventeenth Day of December, 1996

Attest:

BRUCE LEHMAN

Attesting Officer     Commissioner of Patents and Trademarks